United States Patent [19]
Werner, Jr. et al.

[11] Patent Number: 5,489,850
[45] Date of Patent: Feb. 6, 1996

[54] BALANCED BEAM ELECTROSTATIC VOLTMETER MODULATOR EMPLOYING A SHIELDED ELECTRODE AND CARBON FIBER CONDUCTORS

[75] Inventors: Alan J. Werner, Jr.; Edward L. Schlueter, Jr., both of Rochester; James F. Smith, Ontario, all of N.Y.

[73] Assignee: Xerox Corporation, Stamford, Conn.

[21] Appl. No.: 237,819

[22] Filed: May 9, 1994

[51] Int. Cl.[6] .................................................. G01R 29/12
[52] U.S. Cl. ......................................... 324/458; 324/72.5
[58] Field of Search .......................... 324/72, 72.5, 457, 324/458

[56] References Cited

U.S. PATENT DOCUMENTS

| | | | |
|---|---|---|---|
| 3,852,667 | 12/1974 | Williams et al. | 324/72 |
| 4,149,119 | 4/1979 | Buchheit | 324/32 |
| 4,318,042 | 3/1982 | Eda et al. | 324/72.5 |
| 4,330,749 | 5/1982 | Eda et al. | 324/458 X |
| 4,614,908 | 9/1986 | Daniele et al. | 324/458 |
| 4,625,176 | 11/1986 | Champion et al. | 324/458 |
| 4,649,336 | 3/1987 | Binder et al. | 324/458 X |
| 4,683,436 | 7/1987 | Suzuki | 324/458 |
| 4,720,682 | 1/1988 | Ikushima et al. | 324/458 |
| 4,763,078 | 8/1988 | Williams | 324/458 |
| 4,835,461 | 5/1989 | Snelling | 324/458 X |
| 5,212,451 | 5/1993 | Werner | 324/458 |
| 5,220,481 | 6/1993 | Swift et al. | 361/225 |
| 5,250,756 | 10/1993 | Swift et al. | 174/119 R |
| 5,259,989 | 11/1993 | Schlueter et al. | 252/500 |
| 5,259,990 | 11/1993 | Schlueter et al. | 252/500 |
| 5,270,660 | 12/1993 | Werner, Jr. et al. | 324/457 |
| 5,286,566 | 2/1994 | Schlueter et al. | 428/413 |
| 5,286,570 | 2/1994 | Schlueter et al. | 428/423.1 |
| 5,323,115 | 6/1994 | Werner, Jr. | 324/458 X |

*Primary Examiner*—Kenneth A. Wieder
*Assistant Examiner*—Diep Do
*Attorney, Agent, or Firm*—Duane C. Basch

[57] ABSTRACT

A non-contacting electrostatic measurement apparatus including a vibratory element and an electrode, affixed to the vibratory element, suitable for sensing a capacitive coupling relationship with an electrostatic field to produce a signal indicative of the magnitude of the electrostatic field. The signal is transmitted to signal processing circuitry via conductive fibers so as to impose little mechanical loading on the vibrating electrode. The electrode may be either unshielded, for an electrically floating electrostatic voltmeter, or shielded, for an electrostatic voltmeter employing electrically grounded components.

24 Claims, 3 Drawing Sheets

BALANCED BEAM ELECTROSTATIC VOLTMETER MODULATOR EMPLOYING A SHIELDED ELECTRODE AND CARBON FIBER CONDUCTORS

The present invention relates generally to an apparatus for the measurement of electrostatic potentials, and more particularly to a sensor or electrode that may be vibrated in an electrostatic field and used to measure an electrostatic field or electrostatic voltage.

CROSS-REFERENCE

The following related application is hereby incorporated by reference for its teachings:

"Improved Electrostatic Voltmeter" Alan J. Werner, application Ser. No. 08/099,290, filed Jul. 29, 1993.

BACKGROUND AND SUMMARY OF THE INVENTION

The electrostatic voltmeter (ESV) which includes the present invention is a device capable of measuring electrostatic fields or potential without current flow through the device. Generally, these devices include a probe or sensor assembly working in conjunction with an associated voltmeter assembly which receives the signals from the probe and produces an output signal. Subsequently, the output signal may be used to drive an indicator, or to control an electrostatic process as a function of the measured electrostatic potential. Thus, the features of the present invention may be used in the printing arts and, more particularly, in an electroreprographic system to control a xerographic process. These electrostatic voltmeters are particularly well suited for measuring photoreceptor surface charge, which in turn allows for the automated adjustment of machine characteristics to achieve high quality reprographic output.

Heretofore, it has been established that a sensing electrode must be modulated with respect to the field being measured in order to accurately measure the field. Essentially, two methods of achieving the required modulation of the electrode are known. The first method requires that the electrode be stationary and that a vibrating element, or vane, be moved between a viewing port and the electrode itself to modulate the field which reaches the electrode. The second method utilizes a moving electrode which is vibrated relative to the surface being measured. Two embodiments of this method are commonly used. A first embodiment moves the electrode in a direction perpendicular to the surface being measured thereby directly varying the capacitance between the electrode and the surface. The second embodiment utilizes an aperture, placed between the electrode and the surface under test, to periodically capacitively couple the electrode and the surface through the aperture as the electrode is moved parallel to the surface. This may be done by affixing the electrode to the end of a vibrating device such as the tine of a tuning fork. An advantage of the second embodiment is that if the electrode is generally centered on the aperture, the motion of the electrode will decouple it from the surface twice during every vibration cycle, effectively doubling the frequency of the modulation as compared to the frequency of the vibrating system. Generally, both the first and the second embodiments utilize a tuning fork to reliably achieve the modulation of the electrode, either by a vane attached to one end of the fork, or by affixing the electrode directly to an end of the fork.

A number of approaches and designs have been proposed for electrostatic voltmeters, of which the following may be relevant:

U.S. Pat. No. 4,763,078 to Williams, issued Aug. 9, 1988, relates to a sensor for an electrostatic voltmeter which consists of a vibratory element supported on one end in the manner of a cantilever beam, a sensitive electrode on the vibratory element for measuring the potential, a driver for vibrating the vibratory element in a direction to vary the capacitive coupling between the electrode and the electrical field being measured, and an amplifier mounted directly on the vibratory element so as to be in synchronous motion with the electrode.

U.S. Pat. No. 4,720,682 to Ikushima et al., issued Jan. 19, 1988, discloses a surface electric potential sensor for detecting the potential on a surface in a non-contacting fashion. U.S. Pat. No. 4,625,176 to Champion et al., issued Nov. 25, 1986, describes a vibrating probe for measuring electrostatic potential associated with electrophotographic copiers and print machines. The probe is made from a single piezoceramic bender element surrounded by a shield at a known potential. U.S. Pat. No. 4,614,908 to Daniele et al., issued Sep. 30, 1986, relates to a probe for electrostatic voltmeters which measures the voltage on a photoconductive surface. U.S. Pat. No. 4,318,042 to Eda et al., issued Mar. 2, 1982, relates to an electrometer probe for measuring the electrostatic potential on the surface of a photoconductive drum, in an electrostatic machine. The probe includes an electrode which is in the form of a strip.

U.S. Pat. No. 4,149,119 to Buchheit, issued Apr. 10, 1979, teaches an electrostatic voltmeter having a probe sensor that is modulated using a rotating vane or shutter arrangement. The probe is also conditioned to receive both A.C. and D.C. signals which are amplified by a D.C. amplifier, where the A.C. signal from the probe is fed back to the D.C. amplifier to stabilize its output. U.S. Pat. No. 3,852,667 to Williams et al., issued Dec. 3, 1974, relates to a probe or sensor for an electrostatic voltmeter including a voltage sensitive electrode which is vibrated within a housing so as to vary the amount of the surface of the electrode which is directly exposed to an external electrical potential through an aperture in the housing.

A preferred approach devised to vibrate the electrode in an electrostatic field in order to measure the electrostatic surface potential, is illustrated in U.S. Pat. No. 5,212,451 to Werner, issued May 18, 1993, the electrostatic voltmeter employs a single balanced beam vibratory element, supported and balanced at its center and driven in a manner to cause a regular vibration of the beam. However, one difficulty with such an embodiment is maintaining electrical contact with an electrode or probe affixed to an end of the vibrating beam in a manner that not only minimizes damping of the beam's vibration, but also allows the continuous operation of the electrostatic voltmeter over repeated vibratory cycles.

U.S. Pat. No. 5,270,660 to Werner et al., issued Dec. 14, 1993, discloses an electrostatic voltmeter requiring a modulator that floats at a potential equal to the potential being measured; requiring a floating power supply to drive the modulator. The electrostatic voltmeter further described in Continuation application Ser. No. 08/099,290 by Werner (filed Jul. 29, 1993), previously incorporated by reference for its teachings, and the vibrating beam modulator disclosed by U.S. Pat. No. 5,212,451 enable an ESV having all signal processing accomplished at ground potential with only the electrode and shield "floating" at a different potential, thereby eliminating any need for a floating power supply. However, both of these embodiments place additional constraints on modulator construction and the materials that must be used to insure there is: (a) no stray charge in the probe that can be modulated; (b) no undesired leakage of the coupled signal to ground; and (c) no capacitive coupling between the electrode and the electromechanical mechanism used to drive the modulator. The present invention seeks to achieve these requirements by assuring that all electrically insulating material seen by the electrode is "antistatic" and that all direct coupling to ground is very low leakage with high breakdown voltage, and that the capacitance between the electrode and the beam driving mechanism be minimized.

In accordance with the present invention, there is provided an apparatus for measuring the magnitude of an electrostatic field, comprising: a balanced beam adapted to vibrate; an electrode operatively associated with said balanced beam and insulated therefrom, said electrode moving in unison with said balanced beam in the electrostatic field to produce a high voltage biased signal; a high voltage signal processing circuit; and a multi-stranded conductor for electrically connecting the shielded electrode to the high voltage signal processing circuit, said high voltage signal processing circuit generating, in response to the high voltage biased signal, a second signal, having a lower voltage than the high voltage biased signal, in proportion to the magnitude of the electrostatic field.

In accordance with another aspect of the present invention, there is provided an apparatus for producing a signal representative of the magnitude of an electrostatic field, comprising: a substrate having an electrical contact affixed to a top surface thereof; a vibratory element, mounted upon said substrate and having one end which is free to vibrate; an electrode operatively associated with the vibrating end of said vibratory element, said electrode adapted to move in unison with said vibratory element through the electrostatic field to generate the signal; and a multistranded conductor electrically connecting said electrode to the electrical conductor on the top surface of said substrate to enable the transfer of the signal from the electrode to the electrical contact.

In accordance with yet another aspect of the present invention, there is provided a high voltage conductor for electrically coupling an oscillating member, oscillating with respect to a second member, including a composite conductor including a plurality of carbon fiber strands, said composite conductor having a first end electrically connected to the oscillating member and a second end electrically connected to the second member.

Figure 1:
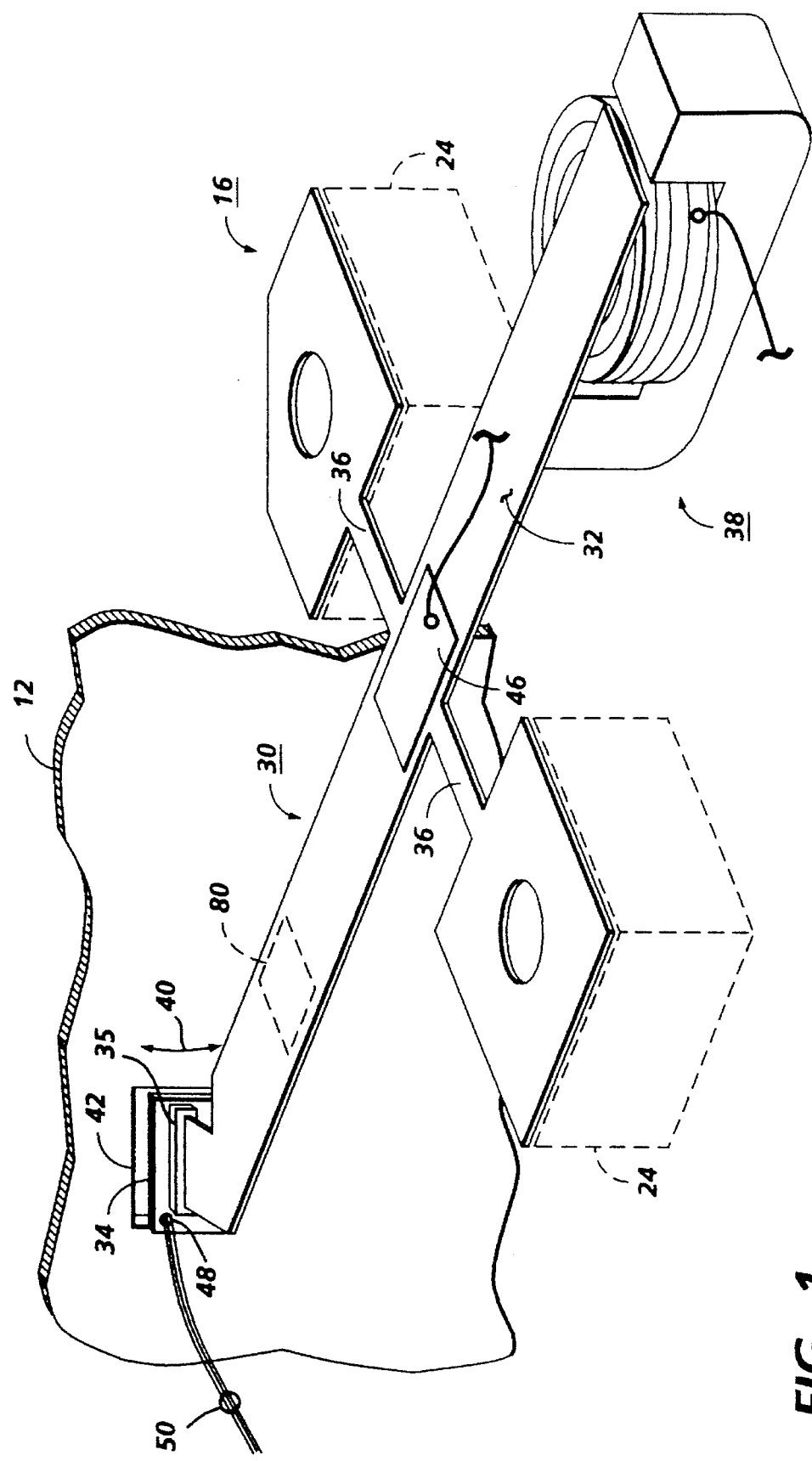
FIG. 1 is an enlarged perspective view of the single balanced beam vibratory element of the present invention, where a sensor element is affixed to one end of the vibratory element.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the single balanced beam electrostatic voltmeter of the present invention, reference is made to the drawings. In the drawings, like reference numerals have been used throughout to designate identical elements. As used herein, the term low voltage is intended to represent potentials of less than approximately 240 volts, and typically in the range of approximately 5 to 25 volts, while the term high voltage is intended to represent potentials up to 1700 and typically in the range of approximately 1000 to 1700 volts.

FIG. 1 shows a modulator assembly 16, including a one-piece vibratory element, 30, which is rigidly affixed to a substrate (not shown) 14 via mounting blocks, or standoffs, 24. Vibratory element 30 includes a longitudinal beam 32 having a probe or sensor electrode 34 permanently affixed to one end thereof, and resilient supports 36 located near the midpoint of the beam to support the beam yet allow oscillation or bending of the ends of the beam. Probe electrode 34 may be any commonly known sensor element suitable for capacitively coupling with an electrostatic field external to housing 12, and thereby producing a signal indicative of the magnitude of said electrostatic field. The signal produced by sensor electrode 34 is preferably supplied to high voltage signal processing circuit 80 via multi-strand conductor 50. Specific details of signal processing circuit 80 may be found in copending application Ser. No. 08/099,290, previously incorporated herein by reference.

Sensor electrode 34 is also insulated from beam 32 by an antistatic layer 35. Antistatic layer 35 is preferably a semiconductive polycarbonate material, however, it may also be a polyester film such as Mylar® (DuPont), a polyurethane material, or a polyimide material. The antistatic layer is affixed to the sensor electrode with an antistatic adhesive, preferably, semiconductive cyanoacrylate adhesives which include Cylok GM and Cylok LR supplied by Lord Corporation, Industrial Adhesives Division. Alternatively, the antistatic adhesive may be an antistatic ultraviolet-curable adhesive or a polyurethane adhesive rendered semiconductive using an ionic quarternary ammonium salt in a manner described in one or more of the following patents by Schlueter et al.: U.S. Pat. Nos. 5,259,989 and 5,259,990 (both issued Nov. 9, 1993), or U.S. Pat. No. 5,286,566 and 5,286,570 (both issued Feb. 15, 1994), all of which are hereby incorporated by reference for their teachings.

Multi-strand conductor 50 preferably consists of very small diameter carbon fibers, on the order of 8 µm in diameter, arranged in parallel strands of approximately 25 to 50 fibers so as to result in insignificant mechanical loading to the end of the vibrating beam where the conductor is attached to electrode 34. The fiber material, further described in detail in U.S. Pat. No. 5,220,481 to Swift et al., issued Jun. 15, 1993, and U.S. Pat. No. 5,250,756, also to Swift et al., issued Oct. 5, 1993, as preferably obtained from controlled heat treatment of polyacrylonite (PAN) precursor fibers to yield at least partial carbonization thereof, is chosen to be a conductive type that gives a low resistance with the few fibers used; in the range of 0Ω (ohm) to 1MΩ and preferably in the range of about 300Ω to 400Ω. Specifically, the ESV described herein attempts to measure the electrostatic potential without inducing a significant current flow through the multi-strand conductor. Thus, the actual resistance is not critical to the operation of the ESV. In addition, the carbon material itself has an inherent lubricity so as to prevent the fibers from self-abrading over repeated cycling of the vibrating probe. As described, one end of the fibers is affixed to probe electrode 34 to provide electrical contact. In one embodiment the fibers are bonded to the rear of electrode 34 using a small spot of thixotropic cyanoacrylate adhesive 48. Once dried, the bond is overcoated using a conductive silver paint to assure electrical contact between the fibers and the electrode. Alternatively, the fibers may be bonded in contact with electrode 34 using a conductive epoxy, conductive room-temperature vulcanizing (RTV) elastomers or similar conductive adhesives suitable for permanently affixing an end of the carbon fiber conductor to the electrode while providing some electrical conductivity.

The characteristic dimensions of beam 32, preferably made of Ni-Span-C® (a Nickel-Iron-Chromium alloy, available from the International Nickel Co., Inc.), and the location of supports 36 operate to define where the vibrational node, and center of vibration, of the beam will lie. While numerous materials may be used, those that are commonly used for the production of vibrational references, for example tuning forks, exhibit the required mechanical characteristics. Moreover, the present embodiment employs a vibrating member made of a material having a high magnetic permeability so that it will be responsive to an applied magnetic field. Therefore, when beam 30 is induced to vibrate under the influence of magnetic coil 38, located beneath the end of the beam opposite the sensor, electrode 34 will be oscillated in the direction indicated by arrows 40. During the oscillations, the electrode is repeatedly coupled and decoupled to an electrostatic field as it passes aperture 42, located in a side wall of housing 12, at a location proximate the resting or nominal position of the sensor electrode. Oscillation of the electrode causes it to be exposed to the external electrical field passing through the aperture each time it passes the resting position; exposing the electrode twice during each vibratory cycle of the beam, and producing a modulation frequency that is double the vibrational frequency of beam 32. As an alternative, electrode 34 may also be positioned with its resting position away from aperture 42, so that the frequency is not doubled, but remains equal to the vibrational frequency of beam 32.

As previously described, the oscillation of beam 32 is directly influenced by magnetic coil 38, which acts as a driver for the one-piece vibration element. Piezoelectric pickup, 46, located across the vibrational node of beam 32, senses the vibrations of the beam, and provides signals to a feedback control circuit (not shown) so as to control the drive signal supplied to the magnetic coil and, thus, the frequency and mode of the beam vibrations. More specifically, the feedback control regulates the frequency of the AC voltage applied to magnetic coil 38 so as to achieve the desired harmonic vibration of the beam. In one embodiment, a beam having a total length of about 25 millimeters and a width of about 2 millimeters maintains a vibrational amplitude, measured at the end of the beam, of approximately 1 millimeter peak-to-peak at a frequency of about 1 kilohertz (KHz). At the resonant frequency of the beam, the energy required to maintain the vibration is minimized, resulting in additional efficiency and lower driving current for the magnetic coil. Because of the efficiency of the single balanced beam modulator, a lower driving current is required, resulting in reduction of the sensor error caused by the drive signal.

The embodiment depicted in FIG. 1 indicates that piezoelectric pickup 46, which may be any thin or film-type element producing an electrical response to a deflection thereof, is used to monitor the vibration of beam 32, and magnetic coil 38 is used to drive the vibration of the beam. Preferably, the mechanical loading upon the beam resulting from the piezoelectric pickup is minimized to the extent possible. Alternatively, the monitoring and driving operations may be accomplished by, for example, replacing magnetic coil 38 with a second piezoelectric element placed on the underside of the beam, near the center, to drive the beam in response to the electrical drive signals supplied thereto. Accordingly, the scope of the present invention is intended include all such alternative methods of driving and monitoring the vibration of the beam.

Figure 2:
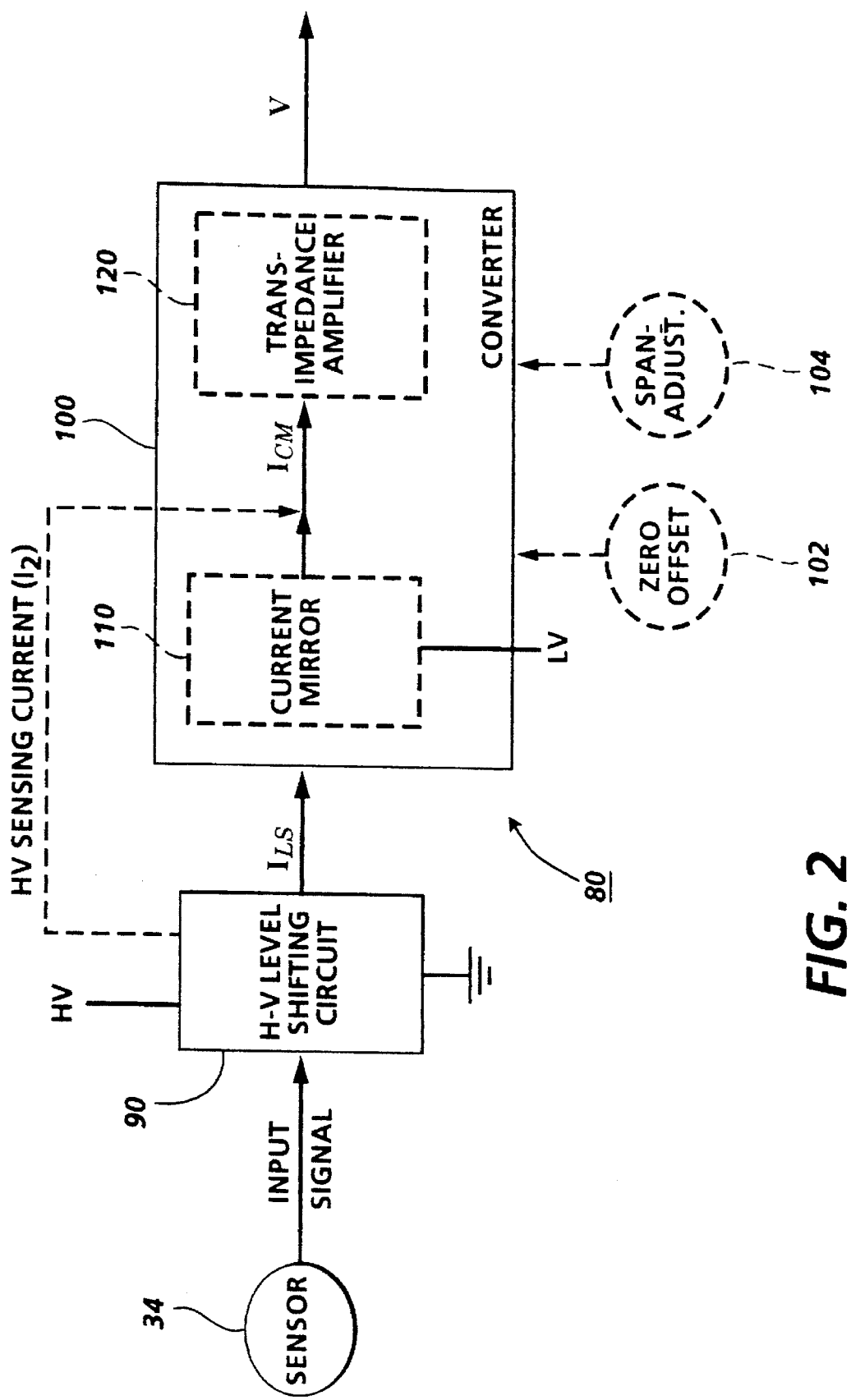
FIG. 2 is a block diagram of the electrical components common to each embodiment of the electrostatic voltmeter.

FIG. 2 is a block diagram illustrating the two primary elements, or blocks, which represent the electrostatic voltmeter circuitry 80. In general, the electrostatic voltmeter generates a low voltage electrical signal, V in response to an electrical signal provided by sensor electrode 34 which is exposed to an electrostatic potential present on a surface (not shown). In the embodiment depicted in FIG. 1, the sensor produces an input signal as a varying voltage signal to represent the electrostatic potential on the surface. More specifically, the input signal is a combination of a varying voltage signal of small amplitude riding on top of a high voltage biasing signal approximating the voltage of the electrostatic field. High-voltage level shifting circuit 90 is connected to the sensor to produce a current signal, $I_{LS}$, referenced to ground potential. The magnitude of $I_{LS}$ is a measure of the surface potential. Subsequently, the current signal is passed to converter 100 to be converted to low voltage electrical signal V. The converter includes current mirror 110, suitable for feeding the level shifted current signal into a transimpedance amplifier 120. Using a desired transfer function, the transimpedance amplifier then transforms the current signal output from the current mirror into a low voltage signal indicative of the surface potential.

Converter 100 may also include two additional elements to implement the desired transfer function; zero offset circuit 102, which allows the output voltage at zero volts input to be offset from zero volts; and span-adjustment circuit 104, which adjusts the ratio between the output voltage span and input voltage span. Further details of the electrical components depicted in FIG. 2 are described in copending application Ser. No. 08/099,290, by Werner, the teachings of which have been incorporated by reference in the instant specification.

In the generalized block diagram depicted in FIG. 2, it is important to recognize that numerous electrical circuits and component combinations may be employed as converter 100 in order to obtain a usable output voltage V. Examples include simple means such as a single resistor, to generate a voltage indicative of the input voltage and range through standard operational amplifier techniques, to replace the relatively simple current mirror and transimpedance amplifier approach. These are well known to those skilled in the art. Having described the general components of the improved electrostatic voltmeter, the remaining figures will be described in detail to illustrate the specific elements which comprise the present invention.

Figure 3:
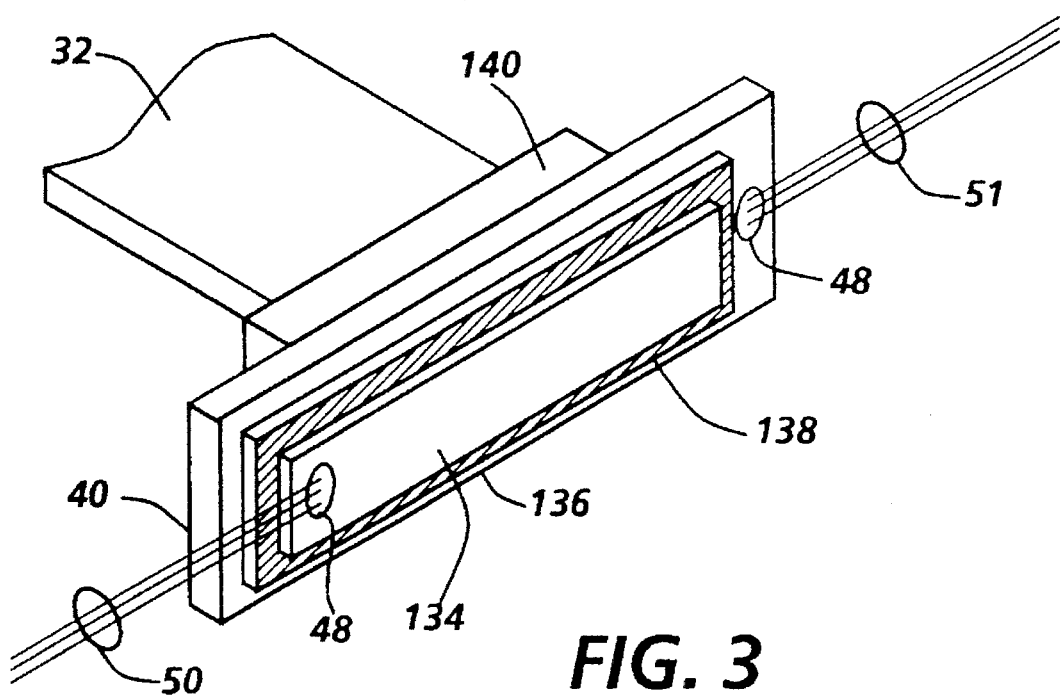
FIG. 3 is a detailed view of the back side of a shielded electrode assembly.
Figure 4:
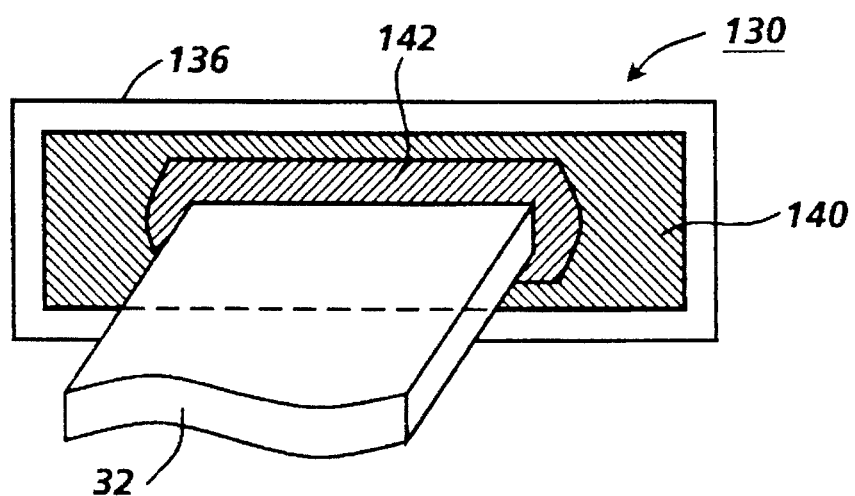
FIG. 4 is a detailed view of the front side of the shielded electrode assembly illustrated in FIG. 3.

FIGS. 3 and 4, respectively, illustrate the front and rear views of a shielded electrode assembly 130. In general, assembly 130 is intended to be used as the probe electrode in electrostatic voltmeters where only the probe electrode and shield are floating at a potential equal to that being measured, while the remaining electrostatic voltmeter components, including the vibrating beam driving circuitry, is grounded. Referring back to FIG. 1, if the electrostatic voltmeter is to be maintained at the floating potential, then the simple electrode 34 insulated by an antistatic layer 35 and affixed to the beam with antistatic material (not shown) will suffice. If, on the other hand, the electrostatic voltmeter drive circuitry is at ground potential and the electrode is floating, then the shielded electrode assembly depicted in FIGS. 3 and 4 is required.

Shielded electrode 130 is assembled in a sandwiched configuration, consisting of a conductive electrode 134 insulated from a somewhat larger conductive shield 136 by an antistatic layer 138. Shield 136 is then insulated from the vibrating beam by a very low leakage, high breakdown voltage layer 140 affixed by a very low leakage, high breakdown voltage adhesive 144. As used herein the term "low leakage" is intended to represent a material volume resistivity in the range of $10^{12}$ to $10^{14}$ ohm cm, preferably about $10^{14}$ ohm cm, and the term "high breakdown voltage" refers to breakdown voltages greater than approximately 2000 volts. Conductive shield 136, preferably formed from a self-supporting metallic layer, is electrically connected to a circuit common of the high voltage input using a second strand of conductive fibers 51, comprised of the same multi-stranded carbon fibers previously described and bonded with adhesive at spot 48. Shield 136 would preferably have a slightly convex shape, with electrode 130 mounted therein, so as to further reduce the possibility of capacitive coupling between the electrode and components of the modulator assembly. Antistatic layer 138 may be any one of a number of antistatic materials, including polycarbonate, polyurethane, polyester and polyimide materials. In an alternative embodiment, where layer 138 is merely an insulating material, the exposed edges thereof (regions not covered by electrode 134) must be coated with an antistatic material so as to prevent the build-up of charge thereon. One material used with success for such a coating is the antistatic cyanoacrylate previously described, although the previously described alternative antistatic adhesives may also work as antistatic coatings.

In one embodiment, conductive shield 136 is a piece of brass shim stock approximately 1.0 mil ($\times 10^{-3}$ inch) thick. Alternatively, copper clad printed wiring board substrate could be used to form one or more portions of the sandwiched configuration. It is critical that the antistatic bonding agent used for the bonding of the electrode to the conductive shield be well separated from the electrically grounded beam. It is also important that any insulating layer exposed to the modulating electrode be antistatic, again, to prevent the build-up of electrical charge. This can be achieved by coating these surfaces with an antistatic insulative material such as the Cylok series of antistatic cyanoacrylate adhesives, distributed by Lord, Inc. which typically exhibit a volume resistivity of $5 \times 10^9$ ohm cm., and may also referred to as semi-conductive materials. Similarly, normal cyanoacrylate adhesives make excellent very low leakage, high breakdown voltage coatings and bonds and are, therefore, the preferred adhesive for the shielded electrode assembly 130.

In recapitulation, the present invention is an apparatus for measuring electrostatic potentials, including a probe electrode that may be vibrated in an electrostatic field and used to measure an electrostatic field or electrostatic voltage. The probe electrode produces signals which are transferred to signal processing circuitry via a flexible electrical conductor selected to reduce mechanical loading to the vibratory beam. The probe electrode may also be produced so as to assure that the electrode is insulated from the remaining components of the electrostatic voltmeter, allowing the probe to float at the electrostatic potential while grounding the remaining components.

It is, therefore, apparent that there has been provided, in accordance with the present invention, an apparatus for accurately measuring the magnitude of an electrostatic field. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. An apparatus for measuring the magnitude of an electrostatic field, comprising:

a balanced beam adapted to vibrate about a support at a midpoint thereof;

an electrode operatively associated with said balanced beam and electrically insulated therefrom, said electrode moving in unison with said balanced beam in the electrostatic field to produce a high voltage biased signal;

a high voltage signal processing circuit; and a multi-stranded conductor for electrically connecting the electrode to the high voltage signal processing circuit, said high voltage signal processing circuit generating, in response to the high voltage biased signal, a second signal, having a lower voltage than the high voltage biased signal, in proportion to the magnitude of the electrostatic field.

2. The apparatus of claim 1, wherein said multi-stranded conductor comprises a plurality of strands of carbon fiber.

3. The apparatus of claim 2, wherein said strands of carbon fibers are 8 μm in diameter.

4. The apparatus of claim 2, wherein said multi-stranded conductor comprises at least 25 carbon fiber strands.

5. The apparatus of claim 2, wherein said multi-stranded conductor is affixed to said electrode by a conductive adhesive.

6. The apparatus of claim 2, wherein said multi-stranded conductor is affixed to said electrode by a semiconductive adhesive having a conductive material overcoated thereon to provide electrical contact between said electrode and the multi-stranded conductor.

7. The apparatus of claim 6, wherein said semiconductive adhesive is a semiconductive cyanoacrylate adhesive.

8. The apparatus of claim 1, wherein said electrode is a shielded electrode, comprising:

a conductive electrode associated with a first side of a conductive shield, said conductive shield being larger in size than said conductive electrode and insulated therefrom by an antistatic layer interspersed between the conductive electrode and the first side of said conductive shield.

9. The apparatus of claim 8, wherein said antistatic layer is made of a material selected from the group consisting of:

polycarbonate;

polyester;

polyurethane; and polyimide.

10. The apparatus of claim 8, wherein said antistatic layer comprises:

an electrically insulating inner core; and an antistatic overcoat layer covering all exposed surfaces thereof.

11. The apparatus of claim 10, wherein said antistatic overcoat layer comprises a semiconductive cyanoacrylate adhesive.

12. The apparatus of claim 8, wherein said conductive electrode and said conductive shield are generally planar in shape and made of a material selected from the group consisting of:

brass; and copper.

13. The apparatus of claim 8, wherein said shielded electrode further comprises an insulating antistatic layer that spaces the conductive shield from said balanced beam.

14. The apparatus of claim 13, wherein said insulating layer is affixed to the conductive shield using a low leakage, high breakdown voltage adhesive.

15. The apparatus of claim 14, wherein said low leakage, high breakdown voltage adhesive comprises a cyanoacrylate adhesive.

16. The apparatus of claim 15, wherein cyanoacrylate adhesive consists of an antistatic cyanoacrylate adhesive exhibiting a volume resistivity of at least $5\times10^9$ ohm cm.

17. The apparatus of claim 13, wherein said insulating layer is a very low leakage, high breakdown voltage material selected from the group consisting of:

polycarbonate;

polyester;

polyurethane; and polyimide.

18. The apparatus of claim 1, wherein said high voltage signal processing circuit comprises:

a high-voltage source adapted to produce a first potential having a polarity the same as the electrostatic potential and a magnitude greater than that of the electrostatic potential;

level shifting means, powered by said high-voltage source, for shifting the level of the output signal produced by said electrode, so as to reference the output signal to a ground potential, and generating a first signal in response to the ground potential referenced output signal; and means, connected to receive the first signal from said level shifting means, for converting the first signal to the low voltage signal, wherein said low voltage signal is referenced to ground potential and where the magnitude of the deviation of the low voltage signal from ground potential is proportional to the electrostatic potential on the surface.

19. An apparatus for producing a signal representative of the magnitude of an electrostatic field, comprising:

a vibratory element having one end which is free to vibrate;

an electrode affixed to the vibrating end of said vibratory element, said electrode adapted to move in unison with said vibratory element through the electrostatic field to generate the signal; and a multi-stranded conductor having only first and second opposed ends thereof affixed, wherein the first end is affixed and electrically connected to said electrode to enable the transmission of the signal from the electrode to a high voltage signal processing circuit affixed and electrically connected to the second end of said multi-stranded conductor, said multi-stranded conductor being supported only at the opposed ends thereof so as to apply only insignificant mechanical loading to the vibrating end of said vibratory element.

20. The apparatus of claim 19, wherein said multi-stranded conductor comprises a plurality of strands of carbon fiber.

21. The apparatus of claim 20, wherein said strands of carbon fiber are 8 μm in diameter.

22. The apparatus of claim 20, wherein said multi-stranded conductor comprises at least 25 carbon fiber strands.

23. The apparatus of claim 19, wherein said multi-stranded conductor is affixed to said electrode by a conductive adhesive.

24. The apparatus of claim 19, wherein said multi-stranded conductor is affixed to said electrode by a semi-conductive adhesive having a conductive material overcoated thereon to provide electrical contact between said electrode and the multi-stranded conductor.

* * * * *